United States Patent Office 3,489,563

Patented Jan. 13, 1970

3,489,563

PHOTOLYTIC ETCHING OF NICKEL-CHROMIUM ALLOY

Donald L. Schaefer, Schenectady, N.Y., assignor to General Electric Company, a corporation of New York No Drawing. Filed May 29, 1967, Ser. No. 642,127
Int. Cl. G03c 5/00
U.S. Cl. 96—36 4 Claims

ABSTRACT OF THE DISCLOSURE

A process is disclosed whereby nickel-chromium alloy surfaces and particularly thin supported films of the alloy may be selectively etched by exposing an interface between the alloy surface and an overlying inorganic photodecomposable reagent dissolved in a solid organic polymeric film to activating radiation which produces chemically reactive species which attacks and preferentially etches the nickel-chromium alloy surface.

The invention herein disclosed was made in the course of a contract with the Bureau of Ships, United States Navy.

Attention is drawn at this point to the copending patent application of Schaefer and Burgess, Ser. No. 604,602, entitled "Photolytic Etching of Nickel-Chromium Alloy," filed Dec. 27, 1966 and assigned to the assignee of the present invention.

This invention relates to the etching of metallic nickel-chromium alloys in response to the impingement of activating radiation on the surface thereof and, more particularly, to the provision of a method for the etching of metallic nickel-chromium alloys in the form of thin films evaporated upon a supporting substrate by the reaction of photodecomposable inorganic reagents therewith in response to activating radiation upon an interface between the surface of said film and a solid medium containing said reagents.

BACKGROUND OF THE INVENTION

The use of nickel-chromium films for the electrically conductive paths in so-called printed circuit elements, particularly as electrically resistive paths in miniaturized circuits is known. This alloy is particularly useful for this purpose because it is readily vapor deposited on suitable substrates as electrically conductive thin films of uniform thickness which are chemically and physically stable. However, in order to produce the circuit pattern from these films it has been necessary to employ conventional photoresist etching procedures which have several inherent problems or difficulties. For example, the edge resolution achievable with these materials is of uncertain quality and difficult to reproduce from element to element. During processing, considerable care must be exercised to prevent the residual photoresist pattern from lifting. Undercutting of the insoluble pattern by the etchant is unavoidable and virtually impossible to accurately control which introduces variations in the electrical characteristics of each element for which external compensation may be necessary. The only way in which the resistivity of a given current carrying path may be adjusted is by varying the width of the path since the thickness of the film is constant. Furthermore, great care must be exercised in removing the insoluble photoresist pattern after etching to avoid damaging the resulting metal film circuit pattern. It would be advantageous to eliminate the necessity for the use of the photoresist material and the multiple step process attendant therewith.

It is therefore a principal object of this invention to provide a process for etching predetermined patterns in nickel-chromium alloy surfaces which does not require the application of a photoresist mask to the surface of the film.

A further object of the invention is the provision of a method for the selective etching of a nickel-chromium alloy surface at controllably different rates in different zones thereof simultaneously.

Other and specifically different objects of the invention will become apparent to those skilled in the art from the following disclosure.

SUMMARY OF THE INVENTION

Briefly stated, this invention provides a method for the selective etching of nickel-chromium alloy surfaces and particularly of supported thin alloy films by providing a common interface between the alloy surface and an overlying solid vehicle which contains a photodecomposable material which is nominally inert with respect to the alloy, exposing said interface to a pattern of activating radiation whereby said material is photolytically decomposed to form species which are chemically reactive with the nickel-chromium alloy to form soluble complexes or compounds with the alloy whereupon a pattern is etched in the alloy surface which has a point-to-point correspondence to the pattern of activating radiation and at a rate which is dependent at least in part upon the intensity of the radiation at any given point on the interface.

DESCRIPTION OF THE PREFERRED EMBODIMENTS

More particularly, the following specific working examples demonstrate the invention in greater detail.

Example 1

A solution of about 0.1 molar ferric chloride in a 10 percent by weight of an alcohol soluble butyrate resin (identified as "ASB" by its manufacturer, the Eastman Chemical Co.) in methanol was made. Films of this composition about 10 to 25 microns in thickness were cast upon layers about 500 A. in thickness of an alloy composed of about 80 percent nickel and 20 percent chromium evaporated upon glass substrates. There was no indication of the ferric chloride precipitating out of solution as the film dried, and a clear yellow film resulted. A metal pattern or stencil was placed upon the surface of a solid film and the film exposed to radiation from a 1000 watt mercury lamp through the openings in the pattern or stencil for a time of about 10 minutes. The resin layer was removed by washing in methanol and it was found that the alloy film was etched through to the substrate in the illuminated areas but not in the non-illuminated areas and the products of the etching reaction were easily removed during the resin removal washing step. The etched pattern was sharp with good edge resolution and had a point-to-point correspondence to the pattern of incident radiation formed by the stencil.

It was then conceived that the etching rate or rate of reaction might be improved if a barrier which was transparent to the activating radiation but otherwise impervous to gases or vapors were placed over and in intimate contact with the surface of the film. It was postulated that if the chemically reactive species produced by the photolytic reaction were volatile to any degree, these species might be lost to the atmosphere to such a significant degree that an undesirable concentration gradient might be established in the film during exposure. Such a barrier would tend to reverse the concentration gradient and should improve the rate of reaction.

Example 2

The procedure set forth in Example 1 was repeated except that a transparent "Mylar" film (a polyethyene terephthalate resin manufactured by E. I. du Pont de Nemours & Co., Inc.) about .001 inch in thickness was interposed between the surface of the film and the metal stencil. The exposure time to etch through the 500 A. thick alloy layer was reduced to about two minutes.

The successful etching of nickel-chromium alloy films have been demonstrated for film thicknesses of from 150 A. to 500 A. The thickness of the films are not believed to be critical. Furthermore, by utilizing film transparencies having varying densities or opacites, otherwise called "gray scale," varying rates of etching corresponding to the varying intensities of illumination to which different zones are exposed, different rates of etching are achievable simultaneously.

From the foregoing, it will be apparent that a process has been provided which utilizes a solution of an inorganic etchant in an alcohol soluble film forming organic resin to photolytically etch pattern in an alloy of nickel and chromium. Furthermore, equivalent etching results are obtainable using cupric chloride in place of the ferric chloride. It will also be appreciated by those skilled in the art that other alcohol soluble polymers from which transparent films may be cast may be substituted for the ASB polymer, such as, for example, polyvinyl acetate. Also, ethanol may be substituted for the methanol. For these reasons, it is not intended that the invention shall be limited except as defined by the following claims.

What I claim as new and desire to secure by Letters Patent of the United States is:

In the claims:

1. The method of photoetching nickel-chromium alloy comprising the steps of coating a nickel-chromium alloy surface with a transparent solid layer of an alcohol soluble film forming organic polymer containing therein an alcohol soluble metal chloride compound which is photo decomposable to produce chemically reactive species which attack and etch the nickel chromium alloy, said metal chloride being selected from the group consisting of ferric chloride and cupric chloride and exposing said coated surface to a pattern of activating radiation to form said reactive speces in the illuminated areas.

2. The method set forth in claim 1 wherein said coating is formed by dissolving said organic polymer and said metal chloride in an alcohol selected from the group consisting of ethanol and methanol, applying said solution to said surface, and evaporating said alcohol therefrom until a solid continuous film is formed on said surface.

3. The method set forth in claim 2 wherein said polymer is an alcohol soluble butyrate resin.

4. The method set forth in claim 2 wherein said polymer is an alcohol soluble butyrate resin, said metal chloride is ferric chloride, and said alcohol is methanol.

References Cited

UNITED STATES PATENTS 3,346,384 10/1967 Gaynor ------------- 96—36

GEORGE F. LESMES, Primary Examiner

J. P. BRAMMER, Assistant Examiner

U.S. Cl. X.R.

96—36.2; 204—157.1